United States Patent
Sasaki

(10) Patent No.: US 11,652,271 B2
(45) Date of Patent: May 16, 2023

(54) SUBSTRATE STORAGE STRUCTURE

(71) Applicant: YOKOGAWA ELECTRIC CORPORATION, Tokyo (JP)

(72) Inventor: Keiichi Sasaki, Tokyo (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/474,629

(22) Filed: Sep. 14, 2021

(65) Prior Publication Data

US 2022/0102834 A1    Mar. 31, 2022

(30) Foreign Application Priority Data

Sep. 28, 2020 (JP) ............... JP2020-162747

(51) Int. Cl.
*H01Q 1/22* (2006.01)
*H01Q 1/20* (2006.01)

(52) U.S. Cl.
CPC ............ *H01Q 1/2283* (2013.01); *H01Q 1/20* (2013.01)

(58) Field of Classification Search
CPC .................................... H01Q 1/2283
USPC ..................................... 343/700 R
See application file for complete search history.

(56) References Cited

U.S. PATENT DOCUMENTS

| 2007/0069382 A1* | 3/2007 | Kusumoto ....... G06K 19/07749 257/750 |
|---|---|---|
| 2013/0135169 A1 | 5/2013 | Christie |
| 2019/0013607 A1* | 1/2019 | Naemura ........... H01R 12/7076 |

FOREIGN PATENT DOCUMENTS

| JP | 7-249879 A | 9/1995 |
|---|---|---|
| JP | 2009-94142 A | 4/2009 |
| JP | 2012-505594 A | 3/2012 |
| JP | 2019-49497 A | 3/2019 |
| WO | 2010/044945 A1 | 4/2010 |

OTHER PUBLICATIONS

Yamamoto et al., "Field Wireless Communication Module to Promote Field Wireless", Yokogawa Technical Report, 2014, vol. 57, No. 1, pp. 3-6 and its English Edition, total 8 pages; Cited in Specification.

* cited by examiner

*Primary Examiner* — Peguy Jean Pierre
(74) *Attorney, Agent, or Firm* — Rankin, Hill & Clark LLP

(57) ABSTRACT

A substrate storage structure includes a substrate and a housing configured to store the substrate. The housing includes a thickness direction regulator configured to regulate a position of the substrate from both sides in a thickness direction, a width direction regulator configured to regulate the position of the substrate from both sides in a width direction, and a length direction regulator configured to regulate the position of the substrate from both sides in a length direction. The housing includes a first portion and a second portion connected to the first portion. The first portion includes the thickness direction regulator and a part of the length direction regulator. The second portion includes the width direction regulator and another part of the length direction regulator. This substrate storage structure can allow easy assembly.

9 Claims, 6 Drawing Sheets

SUBSTRATE STORAGE STRUCTURE

CROSS-REFERENCE TO RELATED APPLICATION

The present application claims priority to Japanese Patent Application No. 2020-162747 filed on Sep. 28, 2020, the entire contents of which are incorporated herein by reference.

TECHNICAL FIELD

The present disclosure relates to a substrate storage structure.

BACKGROUND

A known substrate storage structure is, for example, provided in a wireless communication module, or other such component, installed to add a wireless communication function to electronic devices such as field devices used in plants. For example, see Non-patent Literature (NPL) 1.

CITATION LIST

Non-Patent Literature

NPL 1: Shuji Yamamoto, Tetsuo Inagaki, Hideyuki Toda, Kinichi Kitano, Satoshi Mochiduki, "Field Wireless Communication Module to Promote Field Wireless", Yokogawa Electric Corporation, Yokogawa Technical Report Vol. 57, No. 1, 2014, pp. 3-6

SUMMARY

A substrate storage structure according to an embodiment includes a substrate; and a housing configured to store the substrate and including a thickness direction regulator configured to regulate a position of the substrate from both sides in a thickness direction, a width direction regulator configured to regulate the position of the substrate from both sides in a width direction, and a length direction regulator configured to regulate the position of the substrate from both sides in a length direction, wherein the housing includes a first portion and a second portion connected to the first portion, the first portion includes the thickness direction regulator and a part of the length direction regulator, and the second portion includes the width direction regulator and another part of the length direction regulator.

DETAILED DESCRIPTION

Figure 1:
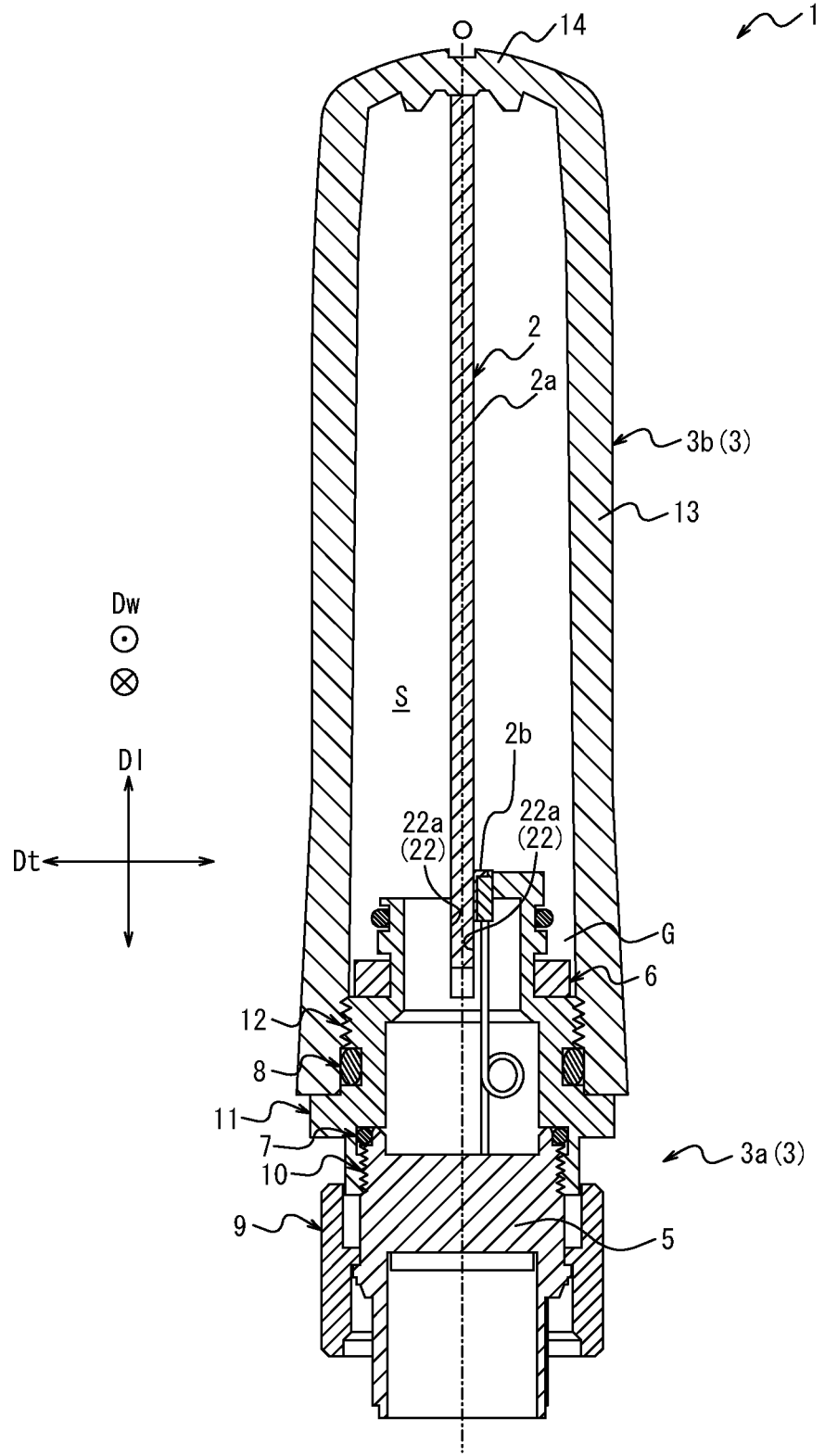
FIG. 1 is a longitudinal cross-sectional view of a substrate storage structure according to an embodiment.

Known substrate storage structures mainly hold substrates by means of potting material that is poured into the housing and hardened. Hence, demand exists for a substrate storage structure that can be assembled more easily.

A substrate storage structure according to an embodiment includes a substrate; and a housing configured to store the substrate and including a thickness direction regulator configured to regulate a position of the substrate from both sides in a thickness direction, a width direction regulator configured to regulate the position of the substrate from both sides in a width direction, and a length direction regulator configured to regulate the position of the substrate from both sides in a length direction, wherein the housing includes a first portion and a second portion connected to the first portion, the first portion includes the thickness direction regulator and a part of the length direction regulator, and the second portion includes the width direction regulator and another part of the length direction regulator. According to this configuration, the first portion of the housing and the second portion of the housing can be connected to each other to regulate the position of the substrate from both sides in the thickness direction, from both sides in the width direction, and from both sides in the length direction, thereby enabling the substrate to be stored in the housing in a firmly held state. This makes simple assembly possible.

In an embodiment, the thickness direction regulator includes a first contact surface configured to contact the substrate from one side in the thickness direction and a second contact surface configured to contact the substrate from the other side in the thickness direction, the width direction regulator includes a first contact surface configured to contact the substrate from one side in the width direction and a second contact surface configured to contact the substrate from the other side in the width direction, the part of the length direction regulator includes a first contact surface configured to contact the substrate from one side in the length direction, and the other part of the length direction regulator includes a second contact surface configured to contact the substrate from the other side in the length direction. This configuration simplifies the structure of the housing, making even simpler assembly possible.

In an embodiment, the first portion includes a cylindrical wall extending in the length direction, and the thickness direction regulator is configured by a slit extending in the length direction from an end face of the cylindrical wall. This configuration simplifies the structure of the housing, making even simpler assembly possible.

In an embodiment, an outer circumferential surface of the cylindrical wall includes a circumferential groove extending circumferentially across the slit, and the substrate storage structure includes an annular holding member that is disposed in the circumferential groove to hold the substrate inserted in the slit. According to this configuration, the substrate can be held even more firmly.

In an embodiment, the part of the length direction regulator is configured by a cushion member. This configuration makes simple assembly possible, even when the length of the substrate varies greatly.

In an embodiment, the second portion is connected to the first portion via a threaded portion centered on an axis parallel to the length direction. According to this configuration, the threaded portion makes even simpler assembly possible.

In an embodiment, the second portion includes a cylindrical width direction regulating wall including an inner circumferential surface that increases in diameter towards a tip thereof and forms the width direction regulator. This configuration simplifies the structure of the housing, making even simpler assembly possible.

In an embodiment, the second portion has a cylindrical shape with one end closed and the other end connected to the first portion, and the second portion is formed from a material integrally connected from the one end to the other end. This configuration simplifies the structure of the second portion of the housing, making even simpler assembly possible.

In an embodiment, the substrate storage structure is a waterproof structure that prevents water from entering an internal space that stores the substrate. This configuration enables a substrate storage structure with a waterproof structure to be assembled simply.

In an embodiment, the substrate includes an antenna for wireless communication. This configuration enables a substrate storage structure for wireless communication to be assembled simply.

In an embodiment, the first portion of the housing includes a housing body made of metal and a cushion member held by the housing body. This configuration simplifies the structure of the second portion of the housing, making even simpler assembly possible.

In an embodiment, the second portion is non-conductive. This configuration enables good wireless communication by the antenna on the substrate.

In an embodiment, the second portion is made of resin. This configuration simplifies the structure of the first portion of the housing, making even simpler assembly possible.

In an embodiment, a first connector held by the first portion is included, and the substrate includes a substrate body and a second connector that is mounted on the substrate body and connects to the first connector. This configuration simplifies the wiring structure for the substrate, making even simpler assembly possible.

In an embodiment, the substrate storage structure is provided in a wireless communication module that is attached to an electronic device to add a wireless communication function to the electronic device. This configuration enables simple assembly of the wireless communication module.

According to the present disclosure, an easy-to-assemble substrate storage structure can be provided.

Embodiments of the present disclosure are described below with reference to the drawings.

Figure 2:
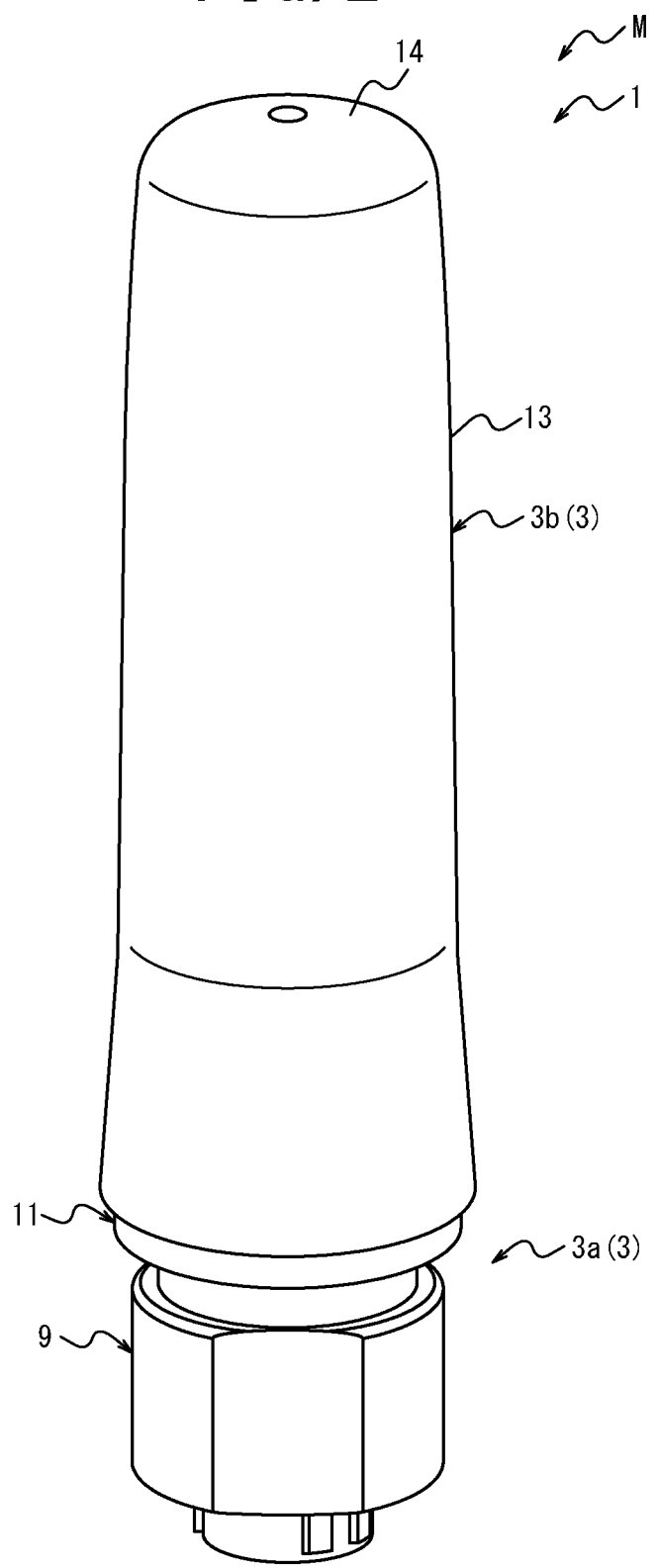
FIG. 2 is a perspective view of the substrate storage structure illustrated in FIG. 1.
Figure 3:
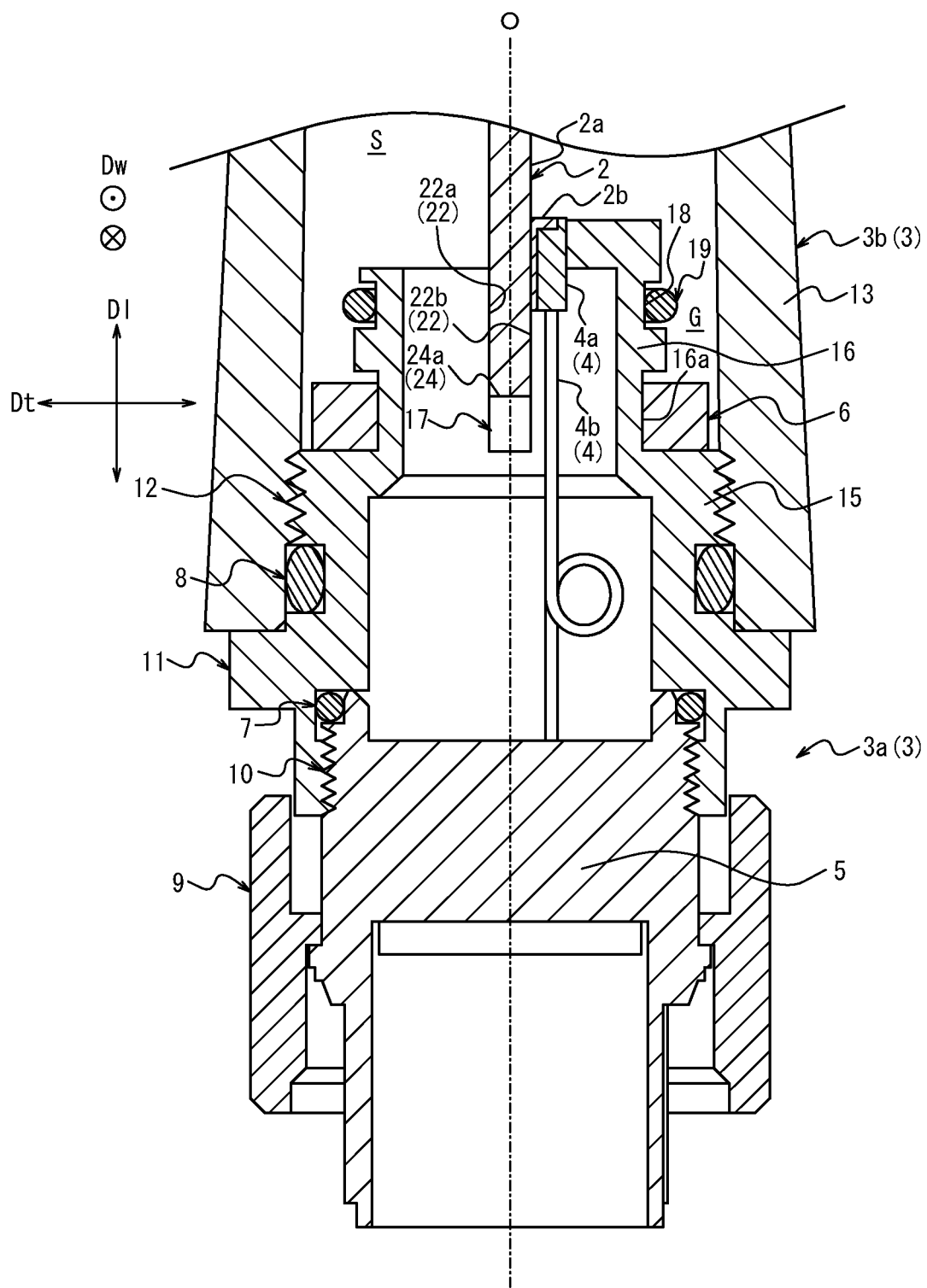
FIG. 3 is an enlarged view of a portion of FIG. 1.

A substrate storage structure 1 according to the present embodiment illustrated in FIGS. 1 to 3 is provided in a wireless communication module M that is attached to an electronic device to add a wireless communication function to the electronic device. The substrate storage structure 1 may be provided directly on the electronic device.

The electronic device is, for example, a field device. A field device is a device used in a plant. Examples of field devices include measurement devices such as thermometers, pressure gauges, flow meters, or vibration meters; driving devices that drive valves, motors, and the like; image capturing devices, such as cameras and video recorders, that capture images of the conditions and objects in the plant; acoustic devices, such as microphones that collect abnormal noises and the like inside the plant and speakers that emit warning sounds or the like; and position detectors that output position information for various devices. Examples of the plant include an industrial plant such as a chemical plant; a plant for managing a well site, such as a gas field or oil field, and the surrounding area; a plant for managing power generation such as hydroelectric power, thermal power, nuclear power, or the like; a plant for managing environmental power generation such as solar power, wind power, or the like; and a plant for managing water and sewage, a dam, or the like.

The substrate storage structure 1 includes a substrate 2, a housing 3, and substrate wiring 4. The housing 3 includes a first portion 3a and a second portion 3b that connects to the first portion 3a.

The first portion 3a includes a housing body 5 made of metal, an elastic annular cushion member 6, an annular first sealing member 7, and an annular second sealing member 8. The cushion member 6, the first sealing member 7, and the second sealing member 8 are held in the main body of the housing body 5. The first portion 3a has a connector member 9 and a joint member 11 that is connected to the connector member 9 via a first threaded portion 10. The connector member 9 includes the first sealing member 7. The joint member 11 includes the cushion member 6 and the second sealing member 8. The housing body 5 is configured by a portion of the connector member 9, excluding the first sealing member 7, made of metal and a portion of the joint member 11, excluding the cushion member 6 and the second sealing member 8, made of metal.

The second portion 3b is formed from a resin material that is cylindrical with one end closed and the other end connected to the joint member 11 via the second threaded portion 12, and that is integrally connected from the one end to the other end. The cushion member 6 is made of, for example, rubber, elastomer, or sponge. The substrate wiring 4 includes a first connector 4a that is held by the joint member 11 and a cable 4b that is connected to the first connector 4a. The connector member 9 connects to an electronic device to add a wireless communication function.

The part forming the housing body 5 in the connector member 9 is configured by two components. The part forming the housing body 5 in the joint member 11 is configured by one component. The second portion 3b is configured by one component.

The substrate 2 includes a substrate body 2a and a second connector 2b that is mounted on the substrate body 2a and connects to the first connector 4a. The substrate 2 also includes a non-illustrated antenna for wireless communication. The substrate 2 has a thickness, width, and length that define a thickness direction Dt, a width direction Dw, and a length direction Dl that are perpendicular to each other.

The second portion 3b includes a cylindrical circumferential wall 13 centered on an axis O parallel to the length direction and an end wall 14 that closes one end of the circumferential wall 13. The first threaded portion 10 and the second threaded portion 12 are each formed so that screwing is performed by rotational movement about the axis O.

In the present embodiment, for the sake of explanation, the direction along the axis O is also referred to as the up-down direction, the direction from the first portion 3a to the second portion 3b along the axis O (upward in FIG. 1) is also referred to as upward, the opposite direction is also referred to as downward, the direction around the axis O is also referred to as the circumferential direction, and the direction along a line orthogonal to the axis O is also referred to as the radial direction.

The first sealing member 7 is disposed to abut against the inside of the first threaded portion 10 and prevents water from entering through the first threaded portion 10 into the internal space S where the substrate 2 is stored. The second sealing member 8 is disposed to abut against the outside of the second threaded portion 12 and prevents water from entering through the second threaded portion 12 into the internal space S. The substrate storage structure 1 is thus a waterproof structure that prevents water from entering the internal space S. The first sealing member 7 and the second sealing member 8 are each formed from rubber or elastomer, for example.

The first threaded portion 10 is configured by a male thread provided on the outer circumferential surface of the connector member 9 and a female thread provided on the inner circumferential surface of the joint member 11. The joint member 11 is connected to the connector member 9 via the first threaded portion 10 while disposed above the connector member 9.

The second threaded portion 12 is configured by a female thread provided on the outer circumferential surface of the joint member 11 and a male thread provided on the inner circumferential surface of the other end of the second portion 3b. The second portion 3b is connected to the joint member 11 via the second threaded portion 12 while disposed above the joint member 11.

The connector member 9 has a substantially cylindrical shape, with one end closed, and is centered on the axis O. The joint member 11 has a cylindrical shape centered on the axis O. The joint member 11 includes a lower circumferential wall 15 with the female thread of the first threaded portion 10 at the lower end and the male thread of the second threaded portion 12 at the upper end, and a cylindrical wall 16 extending upward from the upper end of the lower circumferential wall 15 and having an outer diameter smaller than that of the lower circumferential wall 15.

A gap G is formed between the outer circumferential wall of the cylindrical wall 16 and the inner circumferential wall of the second portion 3b, and the cushion member 6 is disposed in this gap G. The lower surface of the cushion member 6 is supported by the upper surface of the lower circumferential wall 15. A first circumferential groove 16a is provided at the lower end of the outer circumferential surface of the cylindrical wall 16, and the inner circumferential surface of the cushion member 6 is supported by the outer circumferential surface of the cylindrical wall 16 at the first circumferential groove 16a. Therefore, the cushion member 6 is held by fitting to the joint member 11. The cushion member 6 has a constant rectangular cross-sectional shape along the circumferential direction.

Figure 4:
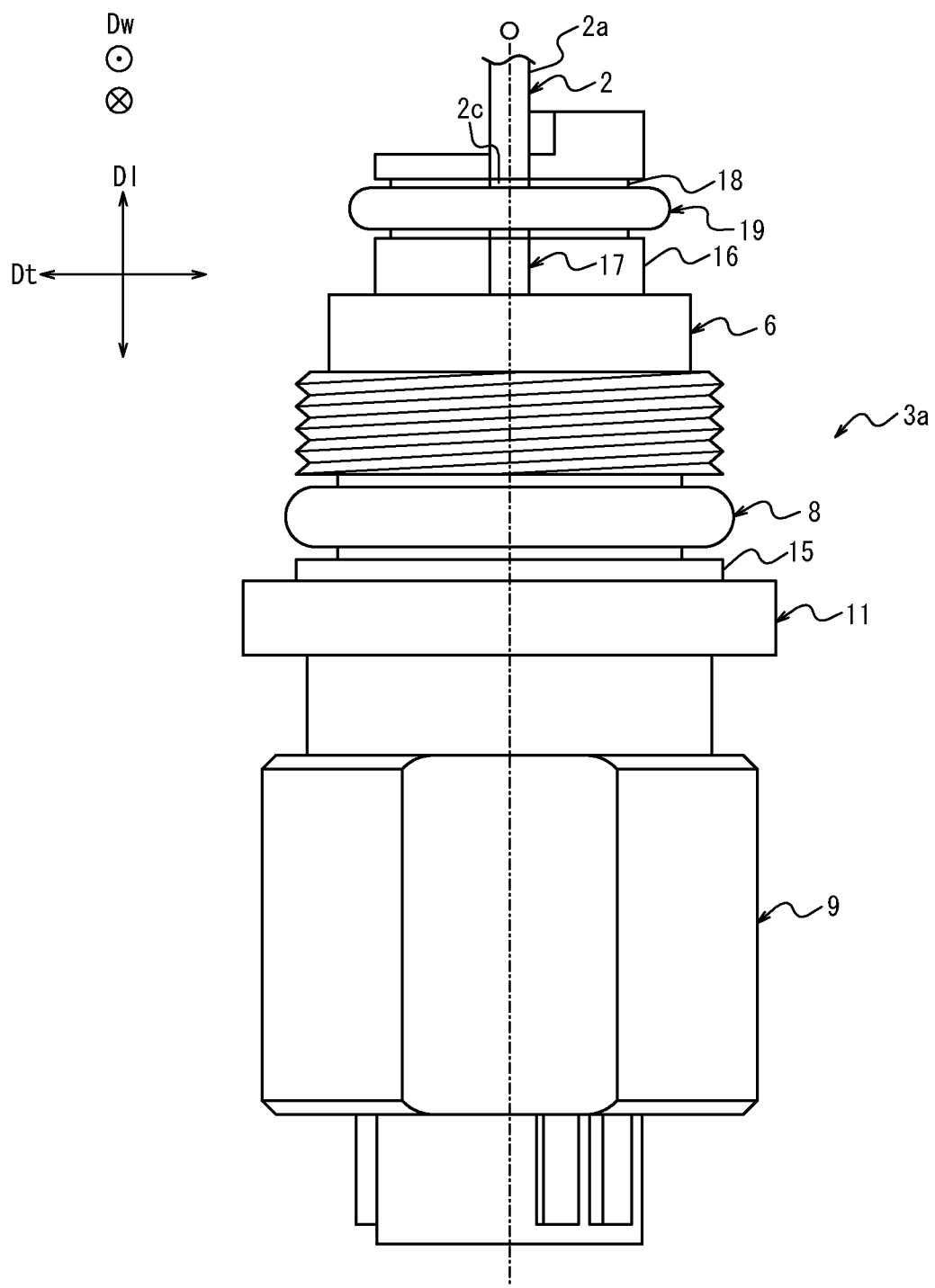
FIG. 4 is a plan view of the substrate storage structure in FIG. 1, illustrating a state in which the substrate is assembled onto a first portion of a housing.
Figure 6:
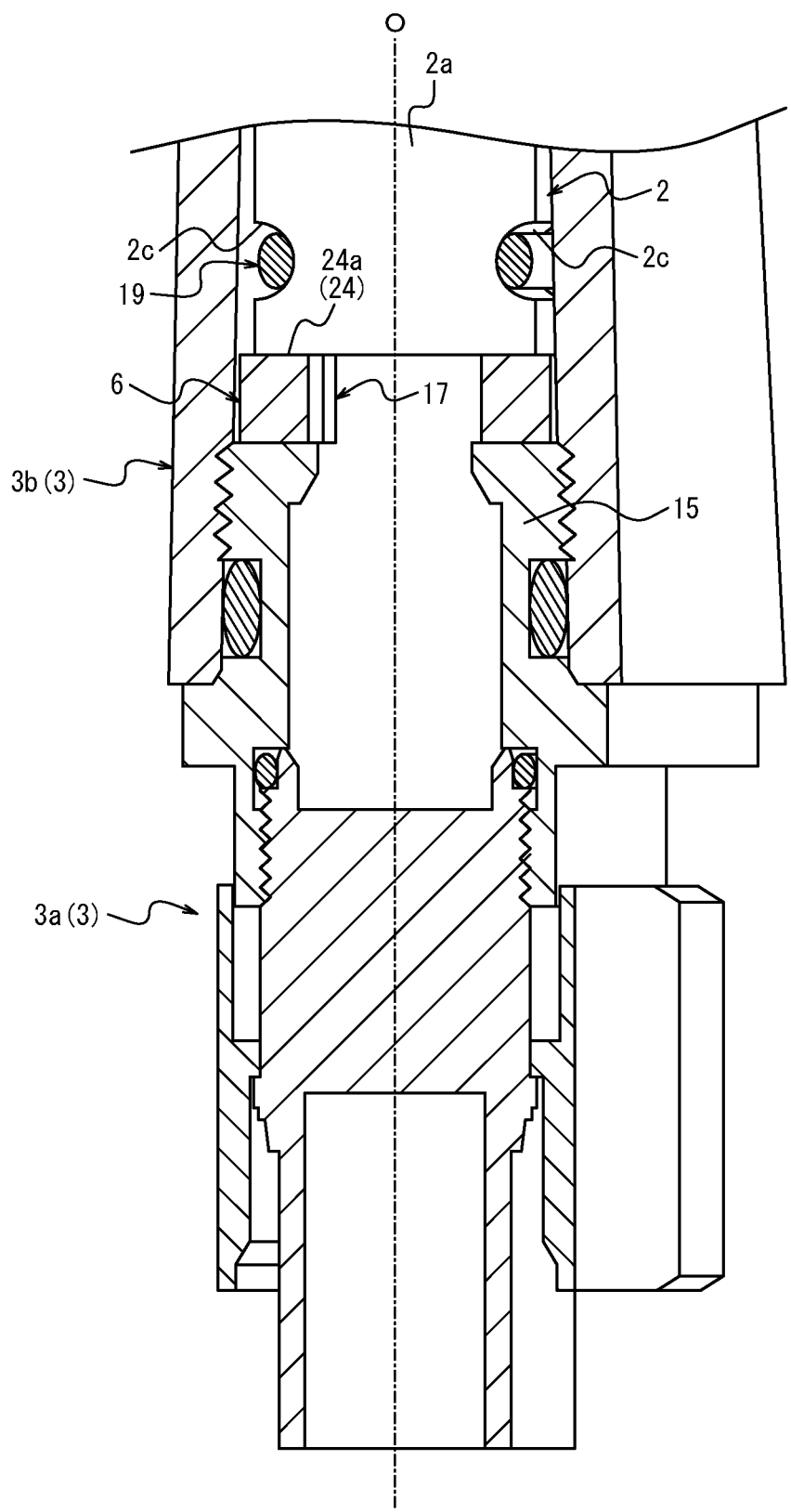
FIG. 6 is a perspective cross-sectional view illustrating a state in which assembly of the second portion of the housing from the state illustrated in FIG. 5 is complete.

As illustrated in FIGS. 3, 4 and 6, the cylindrical wall 16 has a pair of slits 17 extending in the length direction Dl from the upper end face of the cylindrical wall 16. The lower end of the substrate 2 is inserted into each slit 17, and the lower end face of the substrate 2 is supported by the upper surface of the cushion member 6. By the substrate 2 thus being inserted, the second connector 2b held on the substrate 2 is connected to the first connector 4a held on the first portion 3a. The position of the lower end of the substrate 2 is regulated on both sides in the thickness direction Dt by the slits 17.

The outer circumferential surface of the cylindrical wall 16 includes a second circumferential groove 18 extending circumferentially across the pair of slits 17, and the substrate storage structure 1 includes an annular holding member 19 disposed in the second circumferential groove 18 to hold the substrate 2 inserted into the pair of slits 17. The annular holding member 19 is elastic and is formed from rubber or elastomer, for example. The lower end of the substrate 2 has notches 2c on both end faces in the width direction Dw, and the annular holding member 19 is disposed in the notches 2c.

Therefore, the substrate 2 can be held in the first portion 3a by inserting the substrate 2 into the pair of slits 17 of the first portion 3a and then assembling the annular holding member 19. The annular holding member 19 may be assembled first, and then the substrate 2 may be assembled by elastically deforming the annular holding member 19 when inserting the substrate 2 into the pair of slits 17.

Figure 5:
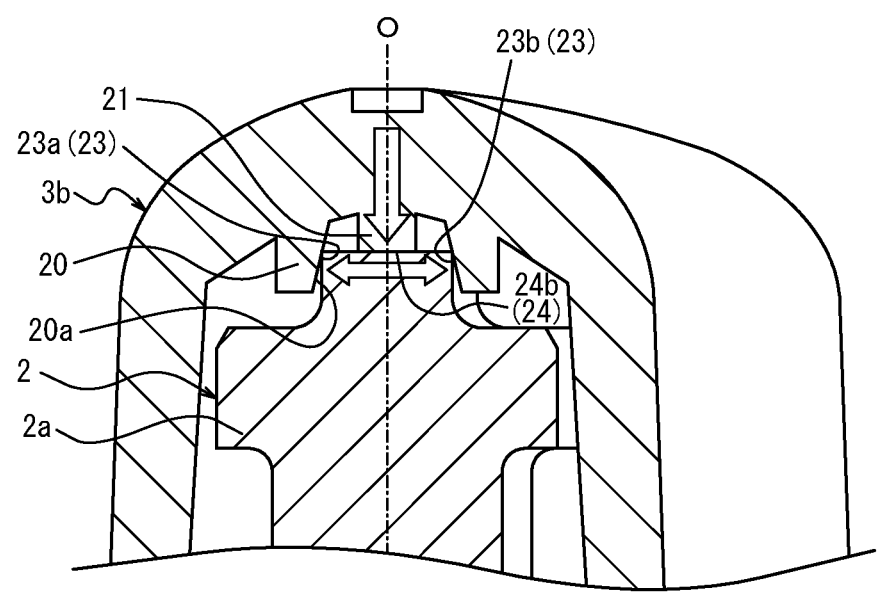
FIG. 5 is a perspective cross-sectional view illustrating a second portion of the housing being assembled from the state illustrated in FIG. 4.

As illustrated in FIG. 5, the second portion 3b includes a cylindrical width direction regulating wall 20 with a conical inner surface 20a that increases in diameter toward the tip (lower end) thereof. The width direction regulating wall 20 extends downward from the end wall 14. The second portion 3b also includes a protrusion 21 extending downward from the end wall 14 on the inside of the width direction regulating wall 20. The protrusion 21 has a columnar shape centered on the axis O.

Accordingly, by assembling the second portion 3b via the second threaded portion 12 onto the first portion 3a, which has the substrate 2 assembled thereon, the lower end of the protrusion 21 can be pressed against the substrate 2 from above, and the inner circumferential surface 20a of the width direction regulating wall 20 can be pressed against the substrate 2 from both sides in the width direction Dw. The position of the upper end of the substrate 2 can thus be regulated in the width direction Dw. Also, at this time, the substrate 2 can sink downward by elastically deforming the cushion member 6. Hence, even if there is a large variation in the dimensions of the substrate 2 in the length direction Dl, the variation can be absorbed by the elastic deformation of the cushion member 6, and the position of the substrate 2 in the length direction Dl can be regulated. Therefore, as illustrated in FIGS. 3 and 6, each of the slits 17 extends lower than the position of the upper surface of the cushion member 6 in the state before elastic deformation.

Such assembly enables the substrate 2 to be stored in the internal space S of the housing 3, as illustrated in FIG. 1. The internal space S is formed by a portion including the inner surface of the second portion 3b, the inner circumferential surface of the joint member 11, and the upper surface of the connector member 9.

As described above, the housing 3 regulates the position of the substrate 2 from both sides in the thickness direction Dt, both sides in the width direction Dw, and both sides in the length direction Dl. In other words, as illustrated in FIGS. 3, 5, and 6, the housing 3 includes the thickness direction regulator 22 that regulates the position of the substrate 2 from both sides in the thickness direction Dt, the width direction regulator 23 that regulates the position of the substrate 2 from both sides in the width direction Dw, and the length direction regulator 24 that regulates the position of the substrate 2 from both sides in the length direction Dl. The first portion 3a incudes the thickness direction regulator 22 and part of the length direction regulator 24, and the second portion 3b includes the width direction regulator 23 and the other part of the length direction regulator 24.

In greater detail, the thickness direction regulator 22 includes a first contact surface 22a configured to contact the substrate 2 from one side in the thickness direction Dt and a second contact surface 22b configured to contact the substrate 2 from the other side in the thickness direction Dt, the width direction regulator 23 includes a first contact surface 23a configured to contact the substrate 2 from one side in the width direction Dw and a second contact surface 23b configured to contact the substrate 2 from the other side in the width direction Dw, part of the length direction regulator 24 includes a first contact surface 24a configured to contact the substrate 2 from one side in the length direction Dl, and the other part of the length direction regulator 24 includes a second contact surface 24b configured to contact the substrate 2 from the other side in the length direction Dl.

The thickness direction regulator 22 is configured by the pair of slits 17. Part of the length direction regulator 24 (first contact surface 24a) is configured by the cushion member 6. The other part of the length direction regulator 24 (second contact surface 24b) is configured by the protrusion 21. The width direction regulator 23 is configured by the inner circumferential surface 20a of the width direction regulating wall 20.

According to the substrate storage structure 1 of the present embodiment, the housing 3 alone can hold the substrate 2 firmly by regulating the position of the substrate 2 from both sides in the thickness direction Dt, both sides in the width direction Dw, and both sides in the length direction Dl. This makes it unnecessary for potting material to be poured into the internal space S and hardened, and enables simple assembly. While the use of potting material is unnecessary according to the present embodiment, potting material may additionally be used for further reinforcement or another such purpose.

The above embodiment is an example of the present disclosure, and a variety of modifications may be made.

For example, the substrate storage structure 1 of the above embodiment can be modified in various ways as described below.

Various modifications can be made to the substrate storage structure 1 according to the above embodiment as long as the following conditions hold: the substrate storage structure 1 includes the substrate 2 and the housing 3 configured to store the substrate 2 and including the thickness direction regulator 22 that regulates the position of the substrate 2 from both sides in the thickness direction Dt, the width direction regulator 23 that regulates the position of the substrate 2 from both sides in the width direction Dw, and the length direction regulator 24 that regulates the position of the substrate 2 from both sides in the length direction Dl; the housing 3 includes the first portion 3a and the second portion 3b connected to the first portion 3a; the first portion 3a includes the thickness direction regulator 22 and a part of the length direction regulator 24; and the second portion 3b includes the width direction regulator 23 and another part of the length direction regulator 24.

However, the thickness direction regulator 22 preferably includes the first contact surface 22a configured to contact the substrate 2 from one side in the thickness direction Dt and the second contact surface 22b configured to contact the substrate 2 from the other side in the thickness direction Dt, the width direction regulator 23 preferably includes the first contact surface 23a configured to contact the substrate 2 from one side in the width direction Dw and the second contact surface 23b configured to contact the substrate 2 from the other side in the width direction Dw, part of the length direction regulator 24 preferably includes the first contact surface 24a configured to contact the substrate 2 from one side in the length direction Dl, and the other part of the length direction regulator 24 preferably includes the second contact surface 24b configured to contact the substrate 2 from the other side in the length direction Dl. The first portion 3a preferably includes the cylindrical wall 16 extending in the length direction Dl, and the thickness direction regulator 22 is preferably configured by the slits 17 extending in the length direction Dl from the end face of the cylindrical wall 16. The outer circumferential surface of the cylindrical wall 16 preferably includes a circumferential groove (second circumferential groove 18) extending circumferentially across the slits 17, and the substrate storage structure 1 preferably includes the annular holding member 19 that is disposed in the circumferential groove (second circumferential groove 18) to hold the substrate 2 inserted in the slits 17. The part of the length direction regulator 24 is preferably configured by the cushion member 6. The second portion 3b is preferably connected to the first portion 3a via a threaded portion (second threaded portion 12) centered on the axis O parallel to the length direction Dl. The second portion 3b preferably includes the cylindrical width direction regulating wall 20, which includes the inner circumferential surface 20a that increases in diameter towards the tip thereof and forms the width direction regulator 23. The second portion 3b preferably has a cylindrical shape with one end closed and the other end connected to the first portion 3a, and the second portion 3b is preferably formed from a material integrally connected from the one end to the other end. A waterproof structure that prevents water from entering the internal space S that stores the substrate 2 is preferably provided. The substrate 2 preferably includes an antenna for wireless communication.

The first portion 3a preferably includes the housing body 5 made of metal and the cushion member 6 held by the housing body 5. The second portion 3b is preferably non-conductive. The second portion 3b is preferably made of resin. The first connector 4a held by the first portion 3a is preferably included, and the substrate 2 preferably includes the substrate body 2a and the second connector 2b that is mounted on the substrate body 2a and connected to the first connector 4a. The substrate storage structure 1 is preferably provided in the wireless communication module M that is attached to an electronic device to add a wireless communication function to the electronic device.

The invention claimed is:
1. A substrate storage structure comprising:
a substrate; and
a housing configured to store the substrate and comprising a thickness direction regulator configured to regulate a position of the substrate from both sides in a thickness direction, a width direction regulator configured to regulate the position of the substrate from both sides in a width direction, and a length direction regulator configured to regulate the position of the substrate from both sides in a length direction, wherein
the housing comprises a first portion and a second portion connected to the first portion,
the first portion comprises the thickness direction regulator and a part of the length direction regulator,
the second portion comprises the width direction regulator and another part of the length direction regulator,
the thickness direction regulator comprises a first contact surface configured to contact the substrate from one side in the thickness direction and a second contact surface configured to contact the substrate from the other side in the thickness direction,
the width direction regulator comprises a first contact surface configured to contact the substrate from one side in the width direction and a second contact surface configured to contact the substrate from the other side in the width direction,
the part of the length direction regulator comprises a first contact surface configured to contact the substrate from one side in the length direction, and
the other part of the length direction regulator comprises a second contact surface configured to contact the substrate from the other side in the length direction.

2. The substrate storage structure of claim 1, wherein the second portion is connected to the first portion via a threaded portion centered on an axis parallel to the length direction.

3. The substrate storage structure of claim 1, wherein the substrate storage structure is a waterproof structure that prevents water from entering an internal space that stores the substrate.

4. The substrate storage structure of claim 1, wherein the substrate comprises an antenna for wireless communication.

5. A substrate storage structure comprising:
a substrate; and
a housing configured to store the substrate and comprising a thickness direction regulator configured to regulate a position of the substrate from both sides in a thickness direction, a width direction regulator configured to regulate the position of the substrate from both sides in a width direction, and a length direction regulator configured to regulate the position of the substrate from both sides in a length direction, wherein
the housing comprises a first portion and a second portion connected to the first portion,
the first portion comprises the thickness direction regulator and a part of the length direction regulator,
the second portion comprises the width direction regulator and another part of the length direction regulator,
the first portion comprises a cylindrical wall extending in the length direction, and
the thickness direction regulator is configured by a slit extending in the length direction from an end face of the cylindrical wall.

6. The substrate storage structure of claim 5, wherein an outer circumferential surface of the cylindrical wall comprises a circumferential groove extending circumferentially across the slit, and
the substrate storage structure comprises an annular holding member that is disposed in the circumferential groove to hold the substrate inserted in the slit.

7. A substrate storage structure comprising:
a substrate; and
a housing configured to store the substrate and comprising a thickness direction regulator configured to regulate a position of the substrate from both sides in a thickness direction, a width direction regulator configured to regulate the position of the substrate from both sides in a width direction, and a length direction regulator configured to regulate the position of the substrate from both sides in a length direction, wherein
the housing comprises a first portion and a second portion connected to the first portion,
the first portion comprises the thickness direction regulator and a part of the length direction regulator,
the second portion comprises the width direction regulator and another part of the length direction regulator, and
the part of the length direction regulator is configured by a cushion member.

8. A substrate storage structure comprising:
a substrate; and
a housing configured to store the substrate and comprising a thickness direction regulator configured to regulate a position of the substrate from both sides in a thickness direction, a width direction regulator configured to regulate the position of the substrate from both sides in a width direction, and a length direction regulator configured to regulate the position of the substrate from both sides in a length direction, wherein
the housing comprises a first portion and a second portion connected to the first portion,
the first portion comprises the thickness direction regulator and a part of the length direction regulator,
the second portion comprises the width direction regulator and another part of the length direction regulator, and
the second portion comprises a cylindrical width direction regulating wall including an inner circumferential surface that increases in diameter towards a tip thereof and forms the width direction regulator.

9. A substrate storage structure comprising:
a substrate; and
a housing configured to store the substrate and comprising a thickness direction regulator configured to regulate a position of the substrate from both sides in a thickness direction, a width direction regulator configured to regulate the position of the substrate from both sides in a width direction, and a length direction regulator configured to regulate the position of the substrate from both sides in a length direction, wherein
the housing comprises a first portion and a second portion connected to the first portion,
the first portion comprises the thickness direction regulator and a part of the length direction regulator,
the second portion comprises the width direction regulator and another part of the length direction regulator, and
the second portion has a cylindrical shape with one end closed and the other end connected to the first portion, and the second portion is formed from a material integrally connected from the one end to the other end.

* * * * *